United States Patent [19]

Varshney

[11] Patent Number: 4,703,436

[45] Date of Patent: Oct. 27, 1987

[54] WAFER LEVEL INTEGRATION TECHNIQUE

[75] Inventor: Ramesh C. Varshney, San Jose, Calif.

[73] Assignee: Inova Microelectronics Corporation, Santa Clara, Calif.

[21] Appl. No.: 576,066

[22] Filed: Feb. 1, 1984

[51] Int. Cl.$^4$ .................... G06F 15/60; G11C 7/00
[52] U.S. Cl. .................................. 364/490; 357/45; 365/201; 437/8
[58] Field of Search ............... 364/200, 900, 490; 365/51, 103, 104, 200, 201, 96; 371/10, 11; 29/574; 357/45

[56] References Cited

U.S. PATENT DOCUMENTS

| | | | |
|---|---|---|---|
| 3,641,661 | 2/1972 | Canning et al. | 29/574 |
| 3,771,217 | 11/1973 | Hartman | 29/574 |
| 3,795,973 | 3/1974 | Calhoun | 29/574 |
| 3,795,974 | 3/1974 | Calhoun | 29/574 |
| 3,795,975 | 3/1974 | Calhoun et al. | 29/574 |
| 3,810,301 | 5/1974 | Cook | 29/574 |
| 3,835,530 | 9/1974 | Kilby | 29/574 |
| 3,861,023 | 1/1975 | Bennett | 29/574 |
| 3,940,740 | 2/1976 | Coontz | 340/166 R |
| 4,007,452 | 2/1977 | Hoff, Jr. | 357/45 |
| 4,038,648 | 7/1977 | Chesley | 364/900 X |
| 4,092,733 | 5/1978 | Coontz et al. | 365/200 |
| 4,122,540 | 10/1978 | Russell et al. | 365/200 |
| 4,188,670 | 2/1980 | Hsia | 365/49 |
| 4,234,888 | 11/1980 | Calhoun et al. | 357/45 |
| 4,254,477 | 3/1981 | Hsia et al. | 365/200 |
| 4,295,182 | 10/1981 | Aubusson et al. | 29/574 |
| 4,354,217 | 10/1982 | Mahon | 365/200 X |
| 4,355,376 | 10/1982 | Gould | 365/200 |
| 4,398,248 | 8/1983 | Hsia et al. | 365/200 X |
| 4,494,220 | 1/1985 | Dumbri et al. | 365/200 |
| 4,523,313 | 6/1985 | Nibby, Jr. et al. | 365/200 X |
| 4,532,611 | 7/1985 | Countryman, Jr. | 365/200 |

FOREIGN PATENT DOCUMENTS

| | | |
|---|---|---|
| 0025347 | 3/1981 | European Pat. Off. . |
| 1117579 | 6/1968 | United Kingdom . |
| 1122749 | 8/1968 | United Kingdom . |
| 1255421 | 12/1971 | United Kingdom . |
| 1271243 | 4/1972 | United Kingdom . |
| 1302959 | 1/1973 | United Kingdom . |
| 1377859 | 12/1974 | United Kingdom . |

OTHER PUBLICATIONS

IEEE Int. Symp. on Circuits & Systems Proc., May 1983, "A Demonstration of Very Large Area Integration Using Laser Restructuring", Raffel et al, pp. 781–784.
IEEE J. Solid State Circuits, vol. SC-7, No. 5 (Oct. 1972), "A Means of Reducing Custom 651 Interconnection Requirements", Calhoun et al, pp. 395–404.
Electronics, Sep. 22, 1983, "Amorphous Vias in Wafer Link Chips", Iversen, pp. 48–49.

Primary Examiner—Errol A. Krass
Assistant Examiner—Kevin J. Teska
Attorney, Agent, or Firm—Townsend and Townsend

[57] ABSTRACT

Wafer level integration is provided by using individually integrated circuits on a wafer substrate and generating an electrically ordered matrix of functional integrated circuits assigned from a random distribution of functional, partially functional, and non-functional circuits. Each circuit is individually tested for functionality and thereafter a conductive grid is formed on said wafer to interconnect all of the circuits on the wafer. Circuits that are tested as being non-functional are isolated prior to formation of the interconnecting grid by eliminating fuses that provide connections between the defective circuit and the conductive grid. Each matrix row includes redundant decoder lines. The redundant decoder lines are programmed to reassign functional circuits from a semiconductor wafer substrate location to a matrix row location in another matrix row having defective circuits. In this way, complete functional matrix rows are formed. Associated input and output lines are assigned in a similar manner to a correct bit position within an input and output byte.

32 Claims, 14 Drawing Figures

PHYSICAL (RANDOM) DISTRIBUTION   ELECTRICAL (SYSTEMATIC) DISTRIBUTION

KEY

▨ ■ = FUNCTIONAL DEVICE

▤ = PARTIALLY FUNCTIONAL DEVICE (A=0)

▬ = PARTIALLY FUNCTIONAL DEVICE (A=1)

☐ = NON FUNCTIONAL DEVICE

WAFER LEVEL INTEGRATION TECHNIQUE

BACKGROUND OF THE INVENTION

1. Field of the Invention

The present invention relates to the fabrication and use of integrated circuits. More particularly, the present invention relates to the mapping of a matrix of functional integrated circuits formed on a semiconductor wafer substrate.

2. Description of the Prior Art

Several techniques have been developed to increase circuit integration by interconnection of functional circuits on a wafer containing a matrix of functional and non-functional circuits. One such technique, referred to as "discretionary wiring", includes individual testing of circuits formed on the wafer, mapping of functional circuits, and formation under computer control of unique metal interconnections for that particular wafer. A mask is used to form a unique metal interconnecting layer that interconnects only the functional circuits. Disadvantages of this technique include the cost of producing a custom mask for each individual wafer and the requirement of a subsequent metallization step that may introduce additional defects, making the wafer completely nonfunctional. As a result, the cost and effort of making the wafer and of generating the custom mask, which is only useful in conjunction with that particular wafer is wasted.

Another technique for increasing circuit integration is disclosed by Russell, et al. in U.S. Pat. No. 4,122,540, issued Oct. 24, 1978 and assigned to Signetics Corporation of Sunnyvale, Calif. The Russell, et al. technique consists of making individual circuits with interconnecting leads and arranging the circuits along an interconnecting grid. Individual circuits are connected to or disconnected from the interconnecting grid according to the circuit's functionality. In contrast to "discretionary wiring", this technique does not require additional processing steps. However, an orthogonal interconnecting grid must be provided on two layers of materials. That is, at least two layers of metal or connect planes are needed for the grid's horizontal and vertical lead lines.

Another disadvantage of the Russell, et al. technique is that a limit is placed on the use of individual functional circuits. Because the circuits are wired in a predetermined manner, ultralarge scale integration may not be complete if there are less than the required number of functional circuits available along a grid line. For example, in a 14×14 matrix of 196 circuits that when integrated yields a 9×8 matrix of 72 functional circuits, it is possible that the 72 required functional circuits may not fall at the required locations on the grid. That is, the 72 functional circuits may be distributed so that they do not make a 9×8 matrix. Thus, the final product may not be a working product having a 9×8 matrix.

The Russell, et al. technique requires significantly more than the required number of functional circuits. For example, 100 functional circuits may be required to form a 9×8 matrix of 72 functional circuits. This is due to the imposition of a wiring grid and lack of flexibility of subsequent wiring (after testing). Russell, et al. eliminates the subsequent metallization step and custom metal mask required by "discretionary wiring" by "wasting" functional circuits.

Another problem with the Russell, et al. technique is the difficulty of testing individual circuits in the presence of the interconnecting grid. To adequately test these circuits without one interfering with results obtained for another, the interconnecting grid must be disconnected from the circuit being tested. The interconnecting grid must thereafter become very low impedance after programming.

Another technique for wafer level integration is given by Chesley in U.S. Pat. No. 4,038,648, issued July 26, 1977. Chesley provides for bypassing non-functional bits of a device through the use of electrical latches. Such technique requires resetting the latches each time the device is powered up. Accordingly, an additional diagnostic and test program is required to reset the latches on power up. Such technique is generally not practical and has the further disadvantage in that the individual circuits are not physically isolated for testing.

SUMMARY OF THE INVENTION

The present invention provides wafer level integration of circuits to allow the assembly of an electrically ordered matrix of functional integrated circuits on a semiconductor wafer. A custom mask is not required for each wafer, as in the discretionary wiring technique. Nor does the present invention initially impose an interconnecting grid on the individual functional circuits. Accordingly, the individual circuits are readily tested. Further, there is no requirement of a percentage-per-row of functional circuits to produce a functional circuit matrix or the need to reconfigure internal circuit latches upon circuit power up.

A preferred embodiment of the invention is illustrated with a 16 k static random access memory circuit as a building block of a 2 M bit memory module, although the invention may be provided as a memory or a non-memory device. In the preferred embodiment, a matrix having 128 memory circuits, arranged in 8 rows×16 columns on an integrated circuit wafer substrate, provides 2 M bits per wafer or 256 k bytes per wafer.

Each circuit is formed on a semiconductor wafer substrate. Each circuit is individually tested for functionality. Thereafter, a generic conductive grid is formed on said wafer to interconnect all of the integrated circuits on the wafer. Circuits that when tested are found non-functional are isolated by eliminating connections between the defective circuit and the conductive grid.

Each matrix row provides several individual circuits and includes a redundant decoder. The redundant decoders are programmed to reassign extra functional circuits from a physical matrix row location to an electrical matrix row location having defective circuits. In this way, complete functional matrix rows are formed and a random distribution of functional circuits is ordered to provide a matrix of functional circuits. By combining redundant decoders and associated extra functional circuits with a primary row decoder and associated circuits, a complete row is provided. Individual circuits are located in a row at a bit position by providing extra bit position wiring for each circuit and by thereafter eliminating the interconnections for all bit positions but that to which the circuit is assigned.

Partially functional circuits are combined with other complementary partially functional circuits to produce a complete functional circuit therefrom. For example, if an upper half of one circuit and a bottom half of another circuit are functional, the devices may be combined electrically to form one complete functional circuit. This is accomplished by combining an address for each portion of the circuit with the same circuit select signal such that the circuit selected corresponds to the address relating to that functional part of the circuit. For example, if a circuit has an upper half functional portion and the address corresponding to the upper half portion is combined (ANDed) with the circuit select signal of the completed circuit, then the upper half functional portion may only be selected when the upper half of the completed circuit is addressed. Similarly, another random circuit that has a bottom half functional portion and the address corresponding to the lower half portion is combined (ANDed) with the same circuit select signal of the completed circuit, then the bottom half functional portion may only be selected when the lower half of the completed circuit is addressed. Thus, when a bottom half portion of the complete circuit is addressed, the partial circuit that is electrically assigned to the upper half portion of the complete circuit at a given matrix location ignores the circuit select signal. Rather, the address is combined with the other circuit having a bottom half functional portion to provide the bottom half portion of the complete circuit for that matrix location. Similarly, the other half portion may be addressed.

Combining partially functional circuits into one complete circuit is not limited to half functional circuits. Using this technique, four partially functional circuits, each one having a different functional quadrant, may be combined into one complete circuit. In such instance, two addresses are combined with the circuit select signal to effect partial circuit selection.

Accordingly, a method is provided for achieving a maximum yield from an integrated circuit wafer having functional, partially functional, and non-functional circuits formed thereon. The physical appearance of a wafer formed according to the present invention is that of a patchwork of useful and non-useful devices. Electrically, a wafer formed according to the present invention is indistinguishable from any fully functional device produced to provide a similar function. A complete system or subsystem may be formed on an integrated wafer, eliminating the cost of scribing the wafer and of packaging separate discrete devices, and then combining the individually packaged devices into a system or subsystem on a printed circuit board. Beside the radical decrease in interconnection cost and in the system's physical size, a substantial increase in execution speed and system reliability is achieved.

DETAILED DESCRIPTION OF A PREFERRED EMBODIMENT

When integrated circuits are formed on a semiconductor wafer, a matrix of functional, partially functional, and non-functional devices is produced. Accordingly, a random physical distribution of functional and partially functional circuits is produced as shown for wafer 10 in FIG. 1. The present invention provides a systematic or electrical redistribution of the functional and partially functional devices to produce a uniform, readily accessed electrical matrix of functional circuits as shown for virtual wafer 12 in FIG. 1. Thus, the present invention is a technique that maps a matrix of integrated circuits formed on a semiconductor wafer substrate.

Figure 1:
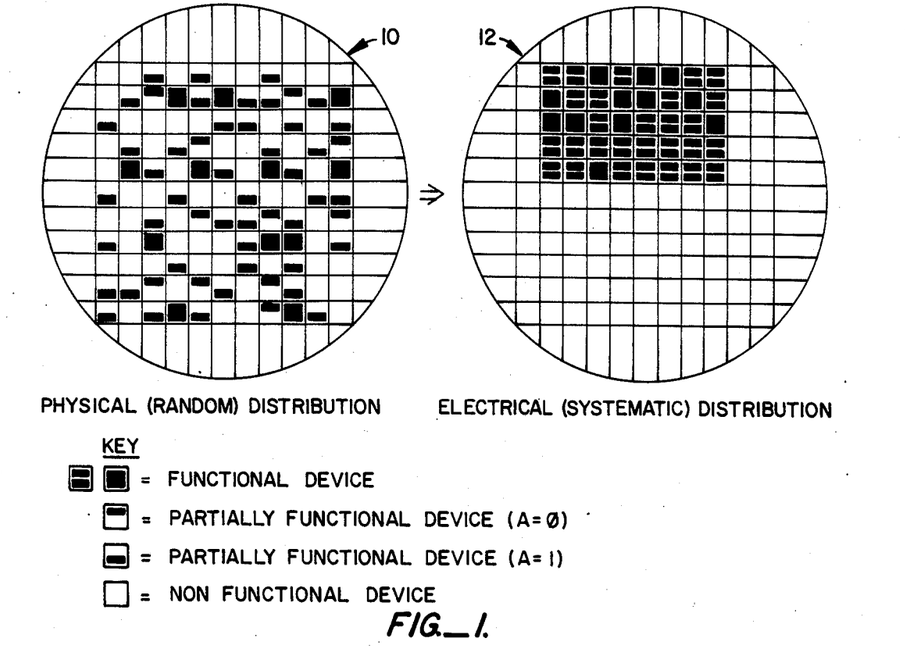
FIG. 1 is a schematic representation of a semiconductor wafer showing a physical (random) distribution of fully and partially functional circuits and an electrical (systematic) distribution of functional circuits.

FIG. 1 displays functional, partially functional, and non-functional devices in an 11×11 matrix. The matrix size discussed herein is for purposes of example only and should not be construed as limiting the invention to any particular matrix size. The present invention may be provided using any number of matrix sizes and may be a uniformly similar functional type of integrated circuit or may be a mixture of different functional types of integrated circuits.

Figure 2:
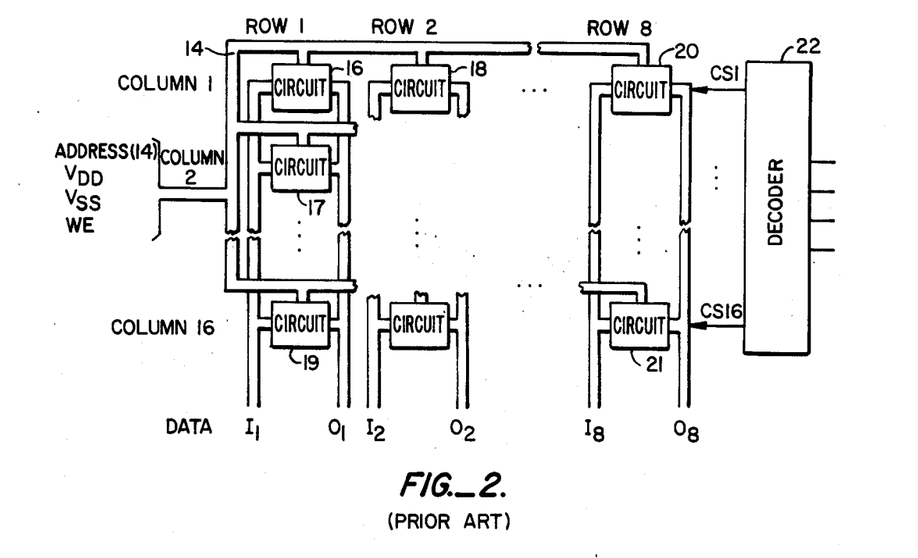
FIG. 2 is a block schematic representation of a prior art random access memory board.

A partial and simplified block diagram of a prior art memory board is shown in FIG. 2. The memory board shown is provided as a basis for discussion of an exemplary embodiment of the present invention. However, the invention is intended for use with any integrated circuit device to provide wafer level integration having maximum functional unit yield. The memory, such as memory 16 shown in FIG. 2, is a 16 k static random access memory. A typical 16 k×1 bit memory device requires the following pin connections: fourteen address lines, one $V_{DD}$, one $V_{SS}$, one circuit select, one write enable, one data in, and one data out—or a total of twenty connections. Generally a printed circuit board is provided with 128 such devices arranged in an 8×16 matrix providing 2 M bits or 256 k bytes of addressable memory space, as shown in FIG. 2.

In the exemplary memory board, seventeen of the twenty connections are provided in parallel to all 128 devices as shown by bus 14 in FIG. 2. Each matrix column includes an input line $I_1$-$I_8$ and an output line $O_1$-$O_8$. Each matrix row includes a circuit select line, CS1-CS16. Circuit select is controlled by a decoder circuit 22. Accordingly, access to any row of memory chips 16-21 is a function of address and circuit select information.

When a byte (8 bits in the exemplary embodiment of the invention) is accessed, a chip select line is activated corresponding to a given row; the desired internal bit position is selected by the address signals.

In the prior art embodiment, such as a printed circuit board, horizontal and vertical lines for interconnecting the memory matrix are formed by different metal layers laminated onto the board. Because all circuits on the board have been previously tested, there is no need to reroute connections from non-functional circuits. The present invention interconnects a matrix of integrated circuits on a semiconductor wafer substrate. Several integrated circuits are formed on the wafer, but without an interconnecting grid.

In the present invention, the individual circuits are tested for functionality. Functional, partially functional, and non-functional circuits are mapped. Thereafter, a metal layer is formed on the wafer substrate to provide an interconnecting grid. The interconnecting grid may be formed by any known technique, including gas deposition, sputtering, X-ray and e-beam lithography. Each circuit is connected to the grid. Non-functional circuits are isolated from the grid as shown in FIG. 3.

Figure 3:
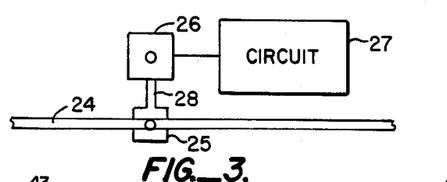
FIG. 3 is a schematic representation of one line of the interconnecting grid and fuse interconnect according to the present invention.

In FIG. 3, a single line 24 of the interconnecting grid is shown including a connecting pad 25 and a test pad 26. Test pad 26 is coupled to integrated circuit 27. Prior to formation of the interconnecting grid, each device is completely electrically isolated from other circuits to allow each device to be tested. Test pad 26 provides a convenient point for connecting a test probe. A single test point 26 is shown for example. There are actually twenty such test points in the preferred embodiment coupled to integrated circuit 27, but only one such test point (and only one such interconnecting grid line) is shown for simplicity.

Figure 4A:
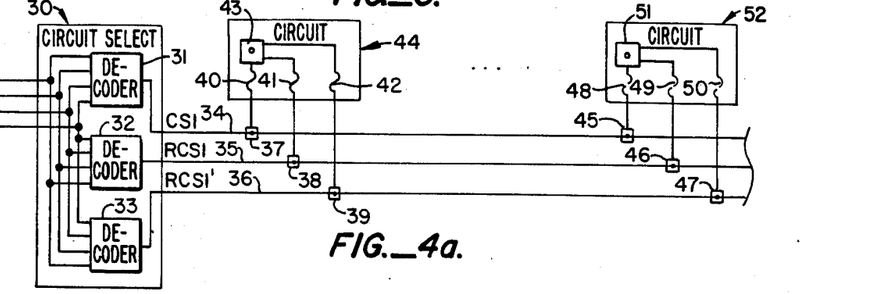
FIGS. 4a and 4b are a schematic diagrams showing regular and redundant circuit select lines and fuses connecting the lines to a circuit.

A link exists between the grid and circuit 27 in the form of a fuse 28. The fuse can be any kind of known integrated circuit fuse device, such as a polysilicon fuse or a metal fuse. The fuses may also be initially non-conductive and may be made conductive by any of the known techniques, such as exposure to a laser or to passive current, or by laser connection of two semiconductor layers. In such applications the process is reversed. That is, functional and partially functional circuits are connected and non-functional circuits are left alone. In the exemplary embodiment of the invention, if device 27 is a non-functional device, then fuse 28 is blown, preferably before formation of the interconnecting grid, by any of the known techniques, such as by a laser beam or by excessive current. In this way, a non-functional circuit is totally isolated from interconnecting grid and does not affect or degrade circuit matrix performance. In the example of FIG. 4a, all such connections shown are severed by blowing appropriate fuses of the non-functional devices. In devices having interconnecting grids formed according to e-beam technology, connections are established to functional and partially functional circuits only—no fuses are used.

For purposes of example a single fuse 28 is shown linking connecting pad 25 to testing pad 26. In actual practice, a single fuse or a group of fuses may be provided at each point to reduce resistance and to increase current carrying capacity, for example the power carrying pads, $V_{SS}$ and $V_{DD}$. Once the non-functional devices are eliminated from the interconnecting grid, the randomly distributed functional and partially functional devices are mapped to form a virtual matrix.

An electronic reorganization of the physical distribution of functional devices is accomplished by assigning circuit select lines and input/output lines in a systematic manner. Circuit select line control is a function of a separate integrated circuit formed on the wafer substrate. Such integrated circuits are decoders. In the example of a 256 k byte memory board, a circuit select device provides four inputs and sixteen outputs. Each line is arranged to connect to a row of eight or more circuits.

A circuit select and decoder arrangement is shown in block diagram form in FIG. 4a. For the purposes of this example, it is assumed that eleven circuits are arranged on a row including circuits 44 and 52. In addition to circuit select line CS1, one or more redundant circuit select lines are coupled to the circuits along the row. Thus, circuit select device 30 includes a primary circuit select decoder 31 and two redundant circuit select decoders 32 and 33, providing circuit select lines CS1, RCS1, and RCS1'. These lines correspond respectively to lines 34, 35, and 36.

For each circuit there is a grid connecting pad corresponding to each select line. Accordingly, circuit 44 includes pads 37–39 and circuit 52 includes pads 45–47. Each pad couples its respective select line to a circuit test pad by way of an interconnecting fuse. For circuit 44, test pad 43 is coupled to line pads 37–39 by fuses 40–42; for circuit 52, test pad 51 is coupled to line pads 45–47 through the fuses 48–50. However, in the example of FIG. 4a, circuit 52 is arbitrarily assigned a defective status to show that the circuit select lines are all isolated from the interconnecting grid in the case of a defective circuit.

Circuit 44 is assigned to any one of the circuit select lines by blowing the fuses for the other two lines. In this way, a defective decoder 31–33 may be eliminated or an otherwise unassigned functional circuit or partially functional circuit may be mapped to a circuit select line for another row.

In the example of a matrix having eleven circuits in a row, let it be assumed that circuit 44 is a functional circuit. Fuses 41 and 42 are blown, severing any connection between circuit select lines 35 and 36 and circuit 44. There are two possibilities in a row of eleven circuits:

(1) there may be 8 or fewer functional circuits in the row; and (2) there may be more than 8 functional circuits in the row.

If there are 8 or fewer functional circuits in the row, then fuses are blown so the redundant circuit select lines 35 and 36 are not connected to any circuits in the row. When there are more than 8 functional circuits in the row, one of the additional circuit select lines 35 and 36 is connected to an additional functional circuit. If circuit 44 is an additional functional circuit on its row, then fuse 40 and one of fuses 41 and 42 is blown.

In the example, assume that a row of circuits is produced (e.g., row 3) that has only five functional circuits, while row one has 11 functional circuits. The primary circuit select line of row three is connected to the five functional circuits of row three. A redundant circuit select line of row one is coupled to the additional three functional circuits of row one. Because the decoder of the additional line on row one is a spare decoder, it may be programmed to have an identical address of the primary circuit select decoder of row three. Accordingly, whenever row three is selected, the primary circuit select line for row three and one of the circuit select lines for row one are both activated. As a result, eight functional circuits are selected—three from row one and five from row three.

Figure 4B:
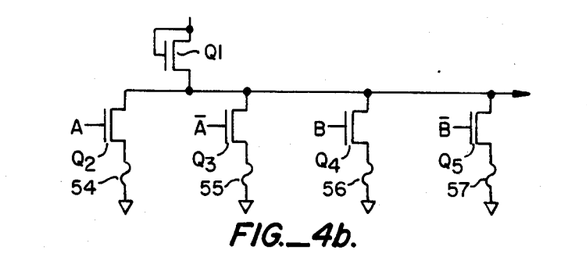

A simplified schematic diagram of a redundant decoder programming circuit is shown in FIG. 4b. A current source transistor Q1 powers a select bus. A series of address transistors Q2–Q5 are operable according to various input addresses (A/$\overline{A}$/B/$\overline{B}$) provided to the circuit select device. Each transistor has a corresponding fuse 54–57. To program the decoder to a particular desired address which, in turn, corresponds to a particular circuit select, the fuses for the transistors that do not correspond to the desired address are blown; the fuses for the transistors that correspond to the desired address are not blown. As a result, the circuit select line is activated when the proper address is provided to the decoder. For simplicity, one out of four select decoders with two addresses and their complements is shown in FIG. 4b. In actual practice there more addresses and transistors in a decoder.

Although not necessary, it is advantageous to test the entire wafer, before fuses are blown to determine which circuits in each row are functional and in this way, optimize the use of functional circuits. In the example above, if row one has two additional functional circuits over the eight needed (a total of ten functional circuits), then the two additional functional circuits may be used with the five functional circuits of row three or they may be used with some other row that has six functional circuits.

An example of the flexibility of this aspect of the present invention involves the situation where two rows do not include a total of eight functional circuits. That is, row three may have five functional circuits and row one may have two extra functional circuits. This provides a total of seven functional circuits. A third row may be found having one additional functional circuit. The third row (e.g. row nine) is then programmed in an identical manner to row three. Thus, all three rows—row one, row three, and row nine—are activated at the same time to provide a row of eight functional devices.

The extreme limit of this aspect of the invention provides a maximum of eight rows with either one additional functional circuit (i.e. a total of nine functional circuits) or with one regular functional circuit, or a combination of both. In this way, a maximum number of circuits are used, providing an enhanced yield and making possible effective wafer level integration.

In the prior art device of FIG. 2, it is shown that fourteen address lines, two power lines, and a write enable line, are commonly shared among all cells in the device. In a wafer level integration, there is no need to reassign these lines but, rather, only to disconnect them from non-functional circuits. The discussion of FIG. 4 relates to the assignment of circuit select lines to assemble rows of functional circuits distributed in a systematic fashion from a series of randomly distributed circuits formed on a semiconductor substrate containing functional, partially functional, and non-functional circuits. Once the random distribution is ordered by assigning circuit select lines, the input and output lines must be assigned to a proper column so that access to a selected and addressed circuit is provided at a proper point. Although this discussion assigns the circuit select lines first and thereafter the output lines, it should be appreciated that the lines may be assigned in any order or may be assigned simultaneously.

In a memory circuit it is desirable to output or input eight bits in parallel during each memory access. When eight circuits are activated by the circuit select line as described above, an output is obtained or input is received in proper order. To achieve this, eight parallel connecting lines are provided along each row of circuits on the wafer substrate.

Figure 5:
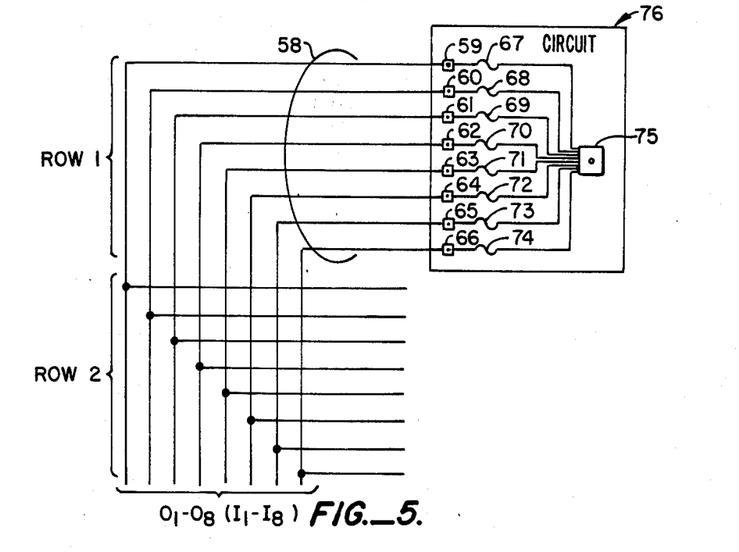
FIG. 5 is a schematic diagram showing input and output lines and fuses connecting these lines to a circuit.

An output bus $O_1$–$O_8$ (or input bus $I_1$–$I_8$) is shown in FIG. 5 including a branch of eight lines for row one and eight lines for row two. Such branches are provided for each row in the matrix. In the example of a memory device, eight such rows are provided. Row bus 58 is shown coupled to circuit 76 at a series of grid connect pads 59–66, which are thereafter coupled to test pad 75 by a plurality of corresponding fuses 67–74. If circuit 76 is not functional, then all eight fuses 67–74 are blown to isolate the circuit from input or output bus 58.

Proceeding along the first row, whenever a first functional circuit is found, fuses 68–74 are blown and the connection is established by fuse 67 for bit position one. When the next functional circuit is found, fuses 67 and 69–74 are blown and the connection is established by fuse 68 for bit position two, and so on. Thus, when a fourth functional circuit is found, all the output fuses except the fourth (70) are blown, corresponding to the fourth bit position.

All functional circuits for a particular row are not necessarily in that particular row. The circuits may be collected from any number of rows up to a maximum of eight rows, as explained above in the example for circuit select lines. Assuming row one has three additional functional circuits and row three has a total of five functional circuits, the three additional functional circuits of row one are connected to the first three output lines of bus 58 and the five circuits of row three are connected to the next five output lines of bus 58. Accordingly, there are always eight outputs provided by eight selected circuits for the eight bit positions of a selected row, regardless of the actual physical location of the functional circuits on the wafer substrate.

Figure 6A:
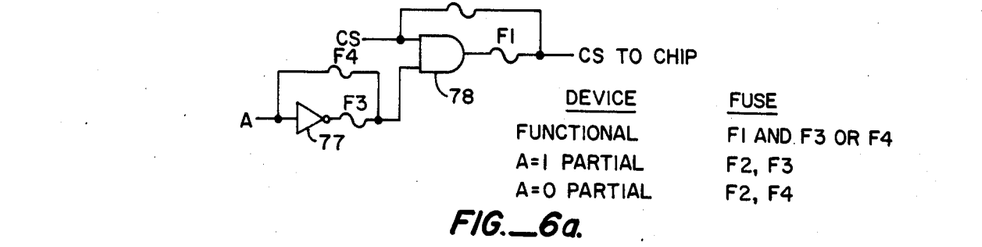
FIGS. 6a-6c provide logic and circuit embodiments by which partially functional circuits may be combined to form a fully functional circuit.
Figure 6B:
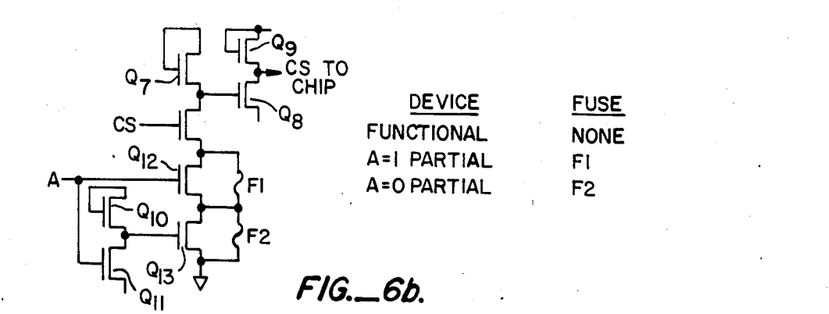
Figure 6C:
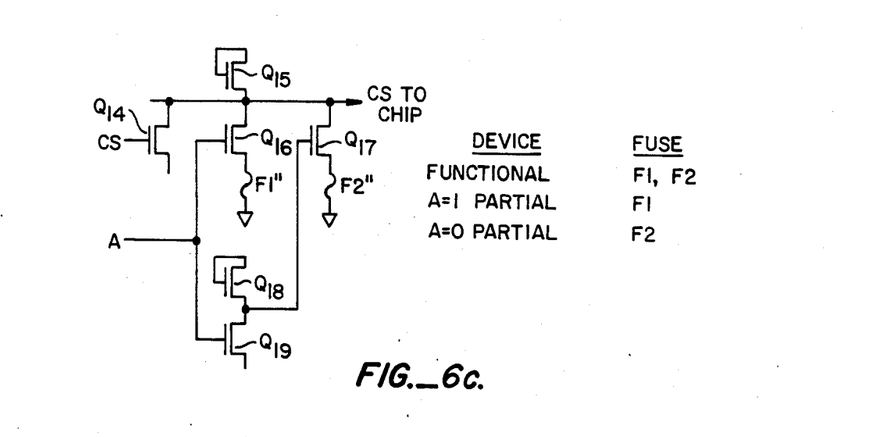

In some instances, a partially functional circuit may be produced. The circuit may be a functional top portion, a bottom portion, a left portion, or a right portion of an otherwise non-functional circuit. The partial circuit is programmed to respond to an address on an address line, e.g. line A. The address line is programmed to cooperate with the circuit select line for a corresponding row to activate the particular circuit when the corresponding bit position is selected. FIG. 6 shows the schematic form embodiments of the invention that assign partial circuits in pairs to form complete functional circuits.

In FIG. 6a, an assignment is made to a partial portion of a circuit corresponding to a circuit upper portion or lower portion (or a left portion or a right portion). Address A is true ("1") if an upper partial portion of a circuit is found; address A is false ("0") if a lower partial portion of a circuit is found. The circuit is programmed by blowing appropriate fuses. If the circuit is entirely functional, only fuses F1 and F4, or F1 and F3 are blown. If in a partially functional circuit address A is to be true, then fuses F2 and F3 are blown. If in a partially functional circuit address A is to be false, then fuses F2 and F4 are blown.

Address A is coupled directly through fuse F4 to AND gate 78, where it is ANDed with the circuit select signal for that row to produce a circuit signal for that partial portion of the circuit. Address A may also be coupled through an inverter 77 and a fuse F3 to AND gate 78 to be ANDed with the circuit select signal to produce a circuit select signal for that partial portion of the circuit.

For example, assume the address line is programmed along with the circuit select line to activate a particular circuit under the condition when A is true, and this portion of the circuit is connected to the I/O lines for a particular bit position, e.g. line four. Then when the next partially functional circuit having a functional portion with address A false is found, it is programmed to be selected when address A is false. The second partial circuit is also connected to the same I/O line, i.e. line four. Accordingly, when A is true, the first circuit is selected and used as half of the circuit and when A is false, the second circuit is selected and used as the other half of the circuit.

If two partial circuits are used with seven fully functional circuits, then a total of nine circuits yield eight functional circuits. It is possible with the present invention to form a complete row of circuits, with sixteen half functional partial circuits. In such instance, a circuit select line for a particular row is connected to all sixteen partial circuits. Half of the circuits are programmed to have address A true and the other half are programmed to have address A false. The eight I/O lines are connected such that one of each line goes to two of the partial circuits, one of which circuit is an address A true circuit and the other of which is an address A false circuit.

FIGS. 6b and 6c show alternate embodiments of the invention for programming a partial address. The embodiment of FIG. 6b represents an embodiment for a circuit having circuit select high when selecting the circuit and requires the blowing of fuse F1' or F2' to assign a partial address to the associated circuit. The embodiment of FIG. 6c represents an embodiment for a circuit having circuit select low when selecting the circuit and requires fewer functional components than the embodiment of FIG. 6b, but requires the additional step of blowing fuses F1" and F2" when a fully functional circuit is addressed.

Known redundancy techniques may be used within each circuit to replace a defective row and/or column. A row of circuits on a wafer similarly may be replaced by a spare row of circuits. For example, one or more spare rows of eight functional circuits may be left on the wafer. These devices are not selected using spare circuit select lines without programming their associated decoders. If, after the formation of the interconnecting grid (for example, during a second metallization step), a row is found defective, then that particular row may be replaced by the spare row on the wafer.

The technique provides the following four redundancy features;

(1) Redundancy within the circuit;
(2) Circuit assignment redundancy;
(3) Partial assignment redundancy; and
(4) Row redundancy.

Redundancy within the circuit (step 1) may be performed by known techniques before an interconnecting grid is formed on the wafer. Circuit assignment and partially functional circuit assignment redundancies (steps 2 and 3) may be performed according to the present invention before or after an interconnecting grid is formed on the wafer. Row redundancy (step 4) is provided after the interconnecting grid is formed on the wafer in accordance with the teachings of the present invention. Using this combination of techniques, a maximum yield of working bits is achieved on a wafer.

In the prior art, partial products are not assembled because of the assembly cost, which is extremely high. Such cost is not typically justified by the return yielded by sale of the product. By using the approach incorporated in the present invention, a partial product is easily used in a wafer level integration, and a heretofore wasted product is used to generate profit.

The present invention generates circuit select signals on the wafer by use of separate decoder circuits formed on the substrate. These circuits may include input-output buffers and/or logic elements. It is also possible to route circuit select addresses to all of the circuits to generate a circuit select signal within each circuit, as described later. When the signals are generated on separate circuits, the circuit select decoders must be operational or the entire wafer is not usable. To ensure that a circuit select decoder is operational, more than one circuit select decoder is integrated on the wafer and wired during the formation of the interconnecting grid. If a decoder is tested and found to be defective, it is disconnected from the interconnecting grid by the blowing of associated fuses, as described above.

Figures 7, 8, 9, 10:
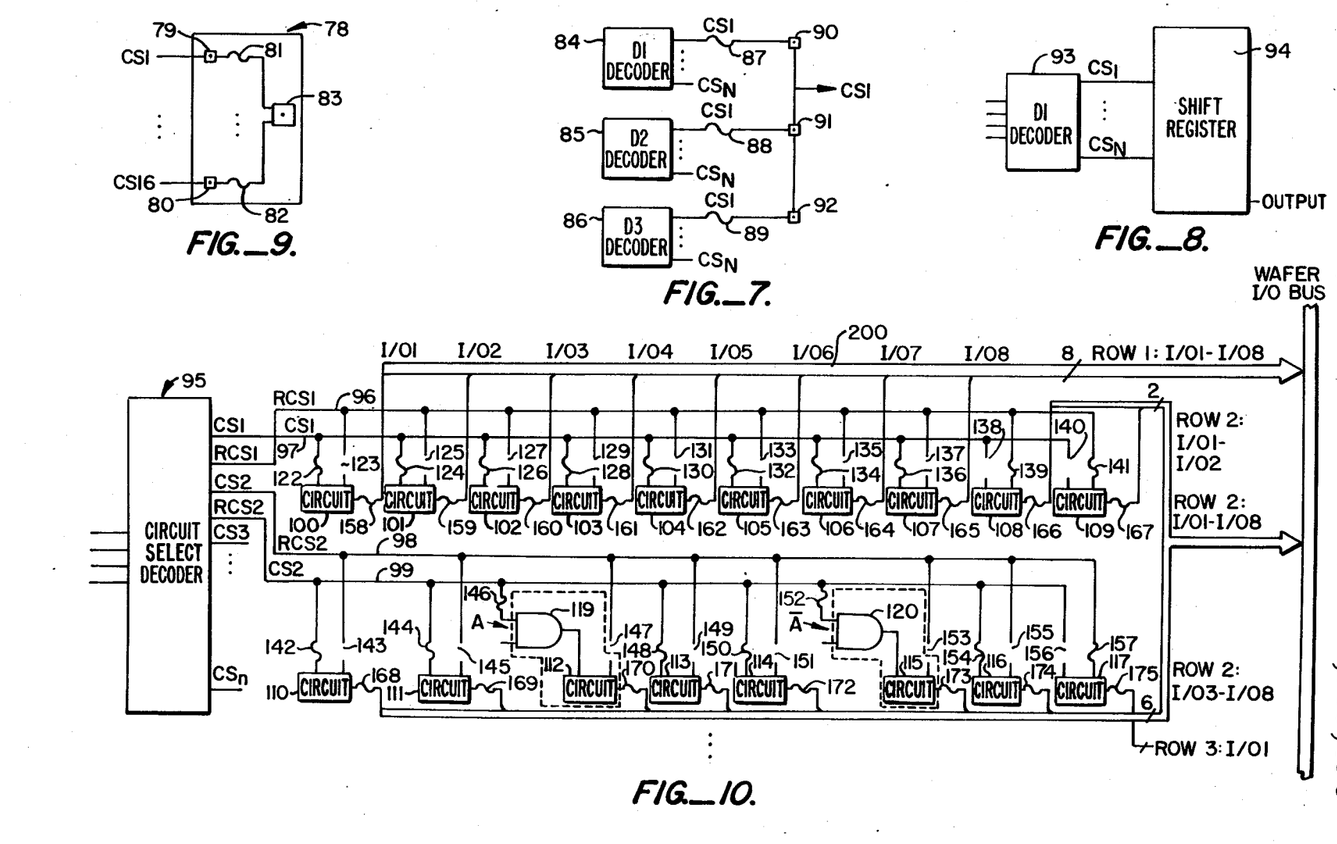
FIG. 7 shows an embodiment of the invention providing for the assignment of several circuits to a particular circuit select line.
FIG. 8 is a block diagram showing a circuit select testing scheme.
FIG. 9 shows an embodiment of the invention providing several programmable circuit select lines.
FIG. 10 is a schematic diagram showing the electrical reconfiguration of randomly distributed circuits to produce a virtual matrix.

FIG. 7 is a block diagram of such an arrangement showing decoder circuits D1-D3 (84-86) coupled via fuses 87-89 to circuit select line connect pads 90-92. To remove a defective circuit select decoder from the interconnecting grid, the associated fuse is blown, thereby isolating the circuit. If decoder D1 is functional and decoders D2 and D3 are non-functional, then decoders D2 and D3 are removed by blowing fuses 88 and 89.

In the embodiment of the invention discussed herein, it is assumed that a circuit formed on the wafer substrate has twenty connections. Accordingly, testing is performed with a probe having twenty connections. The circuit select decoders have somewhat more than twenty connections. This is due to the provision of additional rows. It should be appreciated that more rows are provided than may be necessary to achieve the desired matrix. For example, 64 rows may be provided to achieve a matrix of 16 rows.

All outputs of a decoder must be tested. Testing of the circuit select decoders is shown in block form in FIG. 8, wherein a decoder 93 includes a shift register 94 coupled to the decoders' output. A series of test vectors are provided to an input of the circuit select decoder and the outputs produced in accordance therewith at lines $CS_1$-$CS_N$ are coupled through shift register 94 to produce an output bit form. If the output from the shift register is in agreement with the test vectors provided to the input of decoder 93, then the circuit select decoder is determined to be a functional device. After testing is completed, shift register 94 is isolated from the select circuit decoder by the techniques described herein—that is, the blowing of appropriate fuses.

The discussion relating to FIG. 4 involved the assignment of redundant circuit select lines to otherwise unassigned functional circuits to form functional rows. Another approach to assigning circuit select lines to functional circuits is illustrated in block form in FIG. 9. A functional circuit 78 includes a test pad 83 coupled to sixteen circuit select lines $CS_1$-$CS_{16}$ at line pads 79 and 80 by fuses 81 and 82. To assign circuit 78 to a particular circuit select line to form a row, the fuses for all but that one line are blown. In this way, a circuit located at any point in the matrix may be assigned to any row without regard to physical location.

An electrical reconfiguration of randomly distributed circuits to produce a systematic circuit matrix is shown, in schematic diagram form, in FIG. 10. A circuit select decoder 95 includes circuit select lines CS1-CSn arranged to operate a series of circuits. A first row includes circuits 100-109. Because the example shows ten functional circuits in the first row (non-functional circuits are not shown), and each row is desired to have only eight functional circuits, the first eight circuits 100–107 are shown coupled to line CS1 (97), which is the circuit select line for row one. Accordingly, fuses 122, 124, 126, 128, 130, 132, 134, and 136 remain intact. The fuses that would couple the functional circuits to redundant circuit select line RCS1 (96) are blown. That is, fuses 123, 125, 127, 129, 131, 133, 135, and 137 are blown.

Input and output lines for row one are assigned in bit position order to an input-output bus 200. Thus, for circuits 100–107, which comprise row 1, corresponding bit position fuses 158–165 are shown intact. Each circuits 100–117 include eight input and eight output lines. The fuses for these lines are not shown because the connections for all bit positions in a corresponding input or output byte, except for the assigned bit position, have been eliminated by blowing the corresponding fuses for these positions. For example, fuse 158 couples circuit 100 to bit position one for row one, input (or output) lines in bus 200; fuse 159 couples circuit 101 to bit position two for row one, input (or output) lines in bus 200; and so on.

Circuits 108 and 109 are fully functional extra circuits in row one. They are disconnected from circuit select line CS1 by blowing fuses 138 and 140. A redundant circuit select line for row one (RCS1) is coupled to circuits 108 and 109 by fuses 139 and 141. Redundant circuit select line RCS1 also is not coupled to circuit select line CS2 by a physical connection between circuit select line CS2 and redundant circuit select line RCS1. The preferred method of addressing redundant circuit select line RCS1 when addressing circuit select line CS2 involves programming redundant circuit select line RCS1 to respond to a circuit select CS2 address, as discussed above. Thus, circuits 108 and 109 become the first two circuits for row two.

The input and output line connections of circuits 108 and 109 are connected in bit position order through fuses 166 and 167, respectively. Circuits 108 and 109 provide the first two bit positions for row two. Row two is shown in FIG. 10 including circuits 110–117. In the example, circuits 110, 111, 113, 114, 116 and 117 are shown as fully functional circuits. Circuits 112 and 115 are shown as partially functional circuits. Circuits are assigned to circuit select line CS2 until six circuits in addition to circuits 108 and 109 are grouped to form a complete row of eight functional circuits. The six circuits complete the row begun by the two extra functional circuits of row one. Fuses 142–155 are allowed to remain intact or are blown as is necessary to connect their associated circuits to circuit select line CS2. Likewise, input and output line fuses 168–174 represent corresponding bit position fuses by which the circuits are assigned to their correct bit position to produce an input-output connection for row two.

Circuits 112 and 115 are partially functional circuits. Accordingly, select line CS2 is coupled to AND gates 119 and 120 located within each circuit. An address signal is coupled through AND gates 119 and 120 to enable operation of circuits 112 and 115 when a corresponding portion of the circuit is required. Operation of the AND gate is similar to that for the circuit shown in FIG. 6 and can be programmed on each circuit. Thus, if a bottom half of a circuit is to be addressed, then circuit 112 is selected; if an upper half of the circuit is to be addressed then circuit 115 is selected.

Selection of any one of the cooperating partially functional circuits is a function of address programming. The input and output lines of circuits 112 and 115 are combined to provide a circuit input and output at a proper bit position. In the preferred embodiment, the input and output lines of cooperating partially functional circuits are tied together by assignment of the circuits to a common bit position. This is accomplished by blowing appropriate fuses while leaving corresponding bit position fuses intact. The partial circuits share a common bit position, and the circuit input and output lines are directed to an appropriate selected portion of the total functional circuit.

The input and output lines from circuits 108–116 are combined in parallel to produce an eight-bit input and output bus. Appropriate fuses are blown to route the input and output lines to appropriate bit positions. A remaining functional circuit 117 is shown coupled to a redundant circuit select line RCS2 through a fuse 157. Redundant circuit select line RCS2 is programmed to have the same address as circuit select line CS3. Circuit 117 is assigned via a fuse 175 to a first bit position for row three. Functional circuits on row three (not shown) are thereafter assigned in bit order to complete the row.

As said before, circuit select addresses may be routed to all the circuits and an uncommitted select address decoder may be provided for each circuit to generate a customized circuit select signal. Such an arrangement is shown in schematic form in FIG. 11 wherein a circuit matrix, including circuits 201, 202, and 211, is interconnected by a select address bus 207 and an input and output bus 208. Each circuit has a programmable decoder portion 203, 205, and 209, respectively; and each circuit has a functional portion 204, 206, and 210, respectively. Programmable decoders 203, 205, and 209 include fuses as described herein that are readily severed during the fabrication process to assign an associated functional circuit in a bit or byte arrangement.

Figure 11:
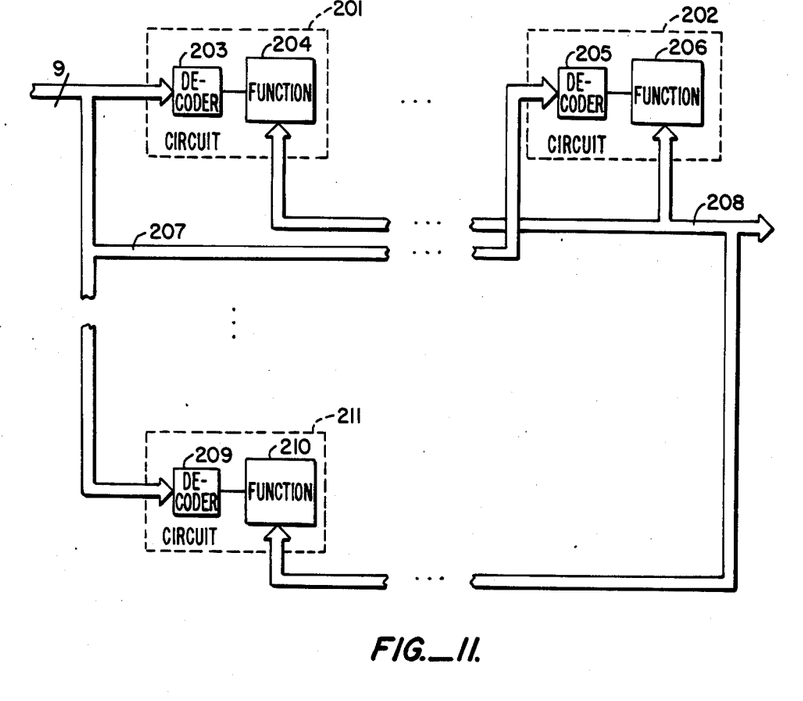
FIG. 11 is a schematic diagram showing each circuit including an uncommitted select address decoder.

For example, on a semiconductor wafer substrate including 128 functional circuits, the circuits can be arranged as a $128 \times 1$ matrix (bit organized) or either a $64 \times 2$, $32 \times 4$, $16 \times 8$, or $8 \times 16$ matrix (byte organized). Such arrangement adds versatility and allows the present invention to be used in any number of circuit applications. A bit organized arrangement is most useful in applications requiring large memory arrays where each semiconductor wafer provides memory for one bit in a byte. A byte organized arrangement is most useful in smaller memory applications where each wafer may provide a total byte memory for an incorporating device, such as a microcomputer.

Table 1 is an example of programming an uncommitted select address decoder in a bit organized application. In the example of FIG. 11, seven select address decoder lines are provided to each uncommitted select address decoder. The actual number of select address decoder lines used determines the number of functional circuits that can be addressed. Fuses in the decoders are allowed to remain intact or are blown to assign an address as shown in Table 1. Thus, when the address '0000000' is received, an individual circuit on the semiconductor wafer substrate is uniquely addressed. The input and output lines for all of the circuits on the semiconductor wafer substrate are tied together to a common bit position. This arrangement is provided to allow the device into which the wafer is incorporated to assign an appropriate bit position. It should be noted that any one I/O line may be left connected and the other seven lines disconnected. These seven lines are disconnected only to minimize the loading on input output pads. Leaving them connected does not ruin the functionality of the circuit but slows down the circuit's performance.

Table 2 shows an uncommitted select address decoder addressing scheme for a byte organized application of the present invention using bit organized individual circuits. Accordingly, the fuses are left intact or blown within each functional circuit in groups of eight in the example to provide an eight bit output for each select address. Thus, a first address '0000000' is coupled to eight functional circuits. The functional circuits have their input and output lines coupled to various bit positions in order to provide an eight bit byte. Likewise, the next eight circuits on the semiconductor wafer substrate are arranged in bit order and are programmed to respond to a next address provided along the select bus. It may be noted that only first four addresses are used in this case and last three addresses are neglected or may be used for the wafer select signal application.

TABLE 1

UNCOMMITTED SELECT ADDRESS DECODER - BIT ORGANIZED FROM BIT ORGANIZED CIRCUITS

| $C_7$ | | | | | | $C_1$ | OUT-PUT | (IN-PUT) | CONNECTED TO: |
|---|---|---|---|---|---|---|---|---|---|
| 0 | 0 | 0 | 0 | 0 | 0 | 0 | $O_1$ | $(I_1)$ | |
| 0 | 0 | 0 | 0 | 0 | 0 | 1 | $O_1$ | $(I_1)$ | $O_2$-$O_8$ $(I_2$-$I_8)$ |
| 0 | 0 | 0 | 0 | 0 | 1 | 0 | $O_1$ | $(I_1)$ | are disconnected |
| 0 | 0 | 0 | 0 | 0 | 1 | 1 | $O_1$ | $(I_1)$ | |

TABLE 2

UNCOMMITTED SELECT ADDRESS DECODER - BYTE ORGANIZED FROM BIT ORGANIZED CIRCUITS

| $C_7$ | | | | | | $C_1$ | OUT-PUT | (IN-PUT) | CONNECTED TO: |
|---|---|---|---|---|---|---|---|---|---|
| 0 | 0 | 0 | 0 | 0 | 0 | 0 | $O_1$ | $(I_1)$ | |
| 0 | 0 | 0 | 0 | 0 | 0 | 0 | $O_2$ | $(I_2)$ | |
| . | | | | | | | . | . | |
| 0 | 0 | 0 | 0 | 0 | 0 | 0 | $O_8$ | $(I_8)$ | |
| 0 | 0 | 0 | 0 | 0 | 0 | 1 | $O_1$ | $(I_1)$ | |
| . | | | | | | | . | . | |
| 0 | 0 | 0 | 0 | 0 | 0 | 1 | $O_8$ | $(I_8)$ | |

Table 3 shows an uncommitted select address decoding scheme for a byte organized application of the present invention using byte organized individual circuits. In such case, the addressing scheme is similar to that of Table 1 except that all the I/O lines are connected to each functional circuit, eliminating the requirement of disconnecting seven pairs of lines. Where byte organized circuits are used, each circuit is provided with eight pairs of I/O pads and eight pairs of connect pads, similar to those shown in FIG. 5. Thus, fuses 67-74 of FIG. 5 would be connected to eight test pads (similar to pad 75 of FIG. 5) of each circuit. Although the use of byte organized individual circuits is not suitable for a bit organized application, it has the advantage of requiring selection of only one circuit rather than eight circuits to read or write a full byte.

TABLE 3

UNCOMMITTED SELECT ADDRESS DECODER - BYTE ORGANIZED FROM BYTE ORGANIZED CIRCUITS

| $C_7$ | | | | | | $C_1$ | OUT-PUT | (IN-PUT) | CONNECTED TO: |
|---|---|---|---|---|---|---|---|---|---|
| 0 | 0 | 0 | 0 | 0 | 0 | 0 | $O_1$-$O_8$ | $(I_1$-$I_8)$ | |
| 0 | 0 | 0 | 0 | 0 | 0 | 1 | $O_1$-$O_8$ | $(I_1$-$I_8)$ | |
| 0 | 0 | 0 | 0 | 0 | 1 | 0 | $O_1$-$O_8$ | $(I_1$-$I_8)$ | |
| 0 | 0 | 0 | 0 | 0 | 1 | 1 | $O_1$-$O_8$ | $(I_1$-$I_8)$ | |

The present invention provides a technique for achieving the long sought goal of true wafer level integration. Although the discussion herein refers to static memory devices, the techniques are intended to be provided for a combination of devices, for example, memory devices such as bipolar, NMOS, CMOS, and CCD memories, including RAMs, ROMs, PROMs, EPROMs, and $E^2$ PROMS; and circuits other than memories wherein the circuits formed on the semiconductor wafer substrate provide similar or non-similar functions. For example, several one-bit processor could be ordered according to the present invention to provide a multi-bit processor. Another example is circuits 84, 85 and 86 in FIG. 7, which include programmable decoders and input-output buffers for memory applications. Other random logic could also be included. Accordingly, the present invention not only improves yields, but reliability is improved. Assembly costs and production costs also are reduced by the elimination of printed circuit boards.

What is claimed is:

1. A method of fabricating a group of interconnected functional circuits on a semiconductor wafer comprising:
   fabricating on the semiconductor wafer a plurality of circuits each circuit having at least one associated interconnecting grid pad, each of the plurality of cirouits being electrically isolated from every other one of the plurality of circuits;
   testing all of the plurality of circuits to determine whether each is a functional circuit or a non-functional circuit;
   isolating each non-functional circuit from at least one of its associated interconnecting grid pads; and
   after performing the step of testing, forming a conductive pattern on the semiconductor wafer to connect all of the interconnecting grid pads which pattern is independent of the distribution of functional and non-functional circuits on the wafer.

2. A method as in claim 1 wherein the plurality of circuits is arranged in rows of n circuits, each row having one row select decoder and at least one redundant row select decoder, each of the n circuits being fusably connected to each of the row select decoders and to each of the redundant row select decoders.

3. A method as in claim 2 further comprising the step of:
   in a first row having r functional circuits, disconnecting each of the r functional circuits from all of the redundant row select decoders, but not from the row select decoder programmable with a first address.

4. A method as in claim 3 further comprising the steps of:

in a second row having s functional circuits, where s<r, disconnecting each of the s functional circuits from all decoders except a redundant decoder programmable with a second address; and in a third row having t functional circuits, where t<r, disconnecting each of the t functional circuits from all decoders except a redundant decoder programmable with the second address, where s+t=r, to thereby provide the second address with the same number of functional circuits as the first address.

5. A method as in claim 2 wherein a set of bit position input and output lines for each bit position in a byte are connected to each one of the plurality of circuit, and the method further comprises:

assigning a pair of the input and output lines to each functional circuit in a bit position order;

isolating each functional circuit assigned a pair of input and output lines from all other bit position input and output lines.

6. A method as in claim 1 wherein the step of testing further comprises testing each of the plurality of circuits for partial functionality to identify functional portions and non-functional portions of each partially functional circuit.

7. A method as in claim 6 wherein each of the plurality of circuits includes a programmable portion decoder for addressing portions of the circuit and wherein the method further comprises:

programming each portion decoder for each partially functional circuit to address the functional portion of each such circuit when that circuit is addressed.

8. A method as in claim 1 wherein the step of isolating each non-functional circuit comprises establishing connections between each functional circuit and its associated interconnecting grid pads, but not establishing connections between each non-functional circuit and at least one of its associated interconnecting grid pads.

9. A method as in claim 1 wherein each circuit of the plurality of circuits includes a fuse connecting that circuit to an associated interconnecting grid pad, and wherein the step of isolating comprises disconnecting each non-fuctional circuit by blowing the fuse.

10. A method as in claim 1 wherein the plurality of circuits is arranged in rows, each row including a plurality of circuit select lines connected to each circuit in the row, and the method further comprises:

assigning functional circuits to a row position by isolating those functional circuits from all of the circuit select lines except that circuit select line corresponding to the row to which those functional circuits are to be assigned.

11. A method of fabricating an electrical matrix of functional memory circuits from a ransom distribution of functional and non-functional electrically isolated memory circuits formed on a semiconductor wafer, each memory circuit having associated therewith at least one interconnecting pad, the method comprising the steps of:

testing each memory circuit for functionality;

isolating each non-functional memory circuit from at least one of its interconnecting pads;

after performing the step of testing, forming a conductive pattern on the semiconductor wafer to interconnect all of the interconnecting pads which pattern is independent of the distribution of functional and non-functional circuits on the wafer;

programming circuit select decoders to assign functional memory circuits to form complete matrix rows; and assigning input-output lines to each functional memory circuit by eliminating connections between each memory circuit and undesired input-output lines.

12. The method of claim 11 further comprising the steps of:

combining partially functional memory circuits to provide a single complete functional memory circuit assigned to a data bit line and circuit select line; and addressing a first partial portion and a second partial portion independently by combining a partial portion address signal with a memory circuit select signal.

13. The method of claim 11 further comprising the steps of:

providing a programmable circuit select address decoder for each functional circuit;

programming each decoder to respond to a unique address, wherein each functional circuit is uniquely addressed; and assigning input and output lines for all functional circuits to provide bit organized input and output.

14. The method of claim 11 further comprising the steps of:

providing a programmable circuit select address decoder for each functional circuit;

programming the circuit select address decoders in byte fashion, wherein each unique address addresses a byte group of functional circuits; and assigning input and output lines within each byte group in bit position order to provide byte organized input and output.

15. The method of claim 11 further comprising the steps of:

providing a programmable circuit select address decoder for each functional circuit;

programming each circuit select address decoder to respond to a unique address, wherein each functional circuit is uniquely addressed; and assigning common input and output lines to each functional circuit in byte fashion, whereby each functional circuit, when addressed, provides byte organized input and output.

16. A semiconductor structure comprising:

a semiconductor wafer;

a plurality of functional and non-functional circuits on the wafer each circuit having associated therewith at least one fusable connection to an associateid interconnecting pad;

a conductive pattern on the wafer to electrically connect all of the interconnecting pads which pattern is independent of the distribution of functional and non-functional circuits on the wafer; and means for assigning an arbitrary address to each of the functional circuits, whereby non-functional circuits are isolated from the conductive pattern by disconnecting at least one of the fusable connections.

17. Apparatus as in claim 16 wherein the plurality of circuits is arranged in rows and the means for assigning comprises:

a programmable decoder for each row fusasbly connected to each circuit in the row; and at least one redundant programmable decoder for each row also fusably connected to each circuit in the row, whereby a circuit is assigned from one row to another row by disconnecting it from all but one redundant decoder in its row and programming that redundant decoder with an address corresponding to another row.

18. Apparatus as in claim 17 further comprising:
a set of input and output leads coupled to each of the plurality of circuits; and
disconnecting means connected between each circuit and each of the input and output leads for disconnecting each circuit from all of the input and output leads except desired ones.

19. Apparatus as in claim 16 wherein the plurality of circuits is arranged in rows, further comprising:
a group of circuit select leads for each row, each of the group being coupled to each of the circuits in that row; and
fusing means connected between each circuit and each lead for assigning each circuit to a desired row, whereby a circuit is assigned to a row by disconnecting that circuit from all of the group of circuit select leads except one corresponding to the desired row.

20. A method of fabricating a group of interconnected functional circuits on a semiconductor wafer comprising:
fabricating on the semiconductor wafer a plurality of circuits arranged in rows of n circuits, each row having one row select decoder and at least one programmable redundant row select decoder, each of the n circuits being fusably connected to each of the row select decoders and to each of the programmable redundant row select decoders, each circuit having at least one associated interconnecting grid pad, and each of the plurality of circuits being electrically isolated from every other one of the plurality of circuits;
testing all of the plurality of circuits to determine whether each is a functional circuit or a non-functional circuit;
isolating each non-functional circuit from at least one of its associated interconnecting grid pads;
in a first row having r functional circuits disconnecting each of the r functional circuits from all of the redundant row select decoders, but not from the row select decoder having a first address; and
after performing the step of testing and disconnecting, forming a conductive pattern on the semiconductor wafer to connect the interconnecting grid pads which pattern is independent of the distribution of functional and non-functional circuits on the wafer.

21. A method as in claim 20 further comprising the steps of:
in a second row having s functional circuits, where $s<r$, disconnecting each of the s functional circuits from all decoders except a decoder having a second address; and
in a third row having at least t functional circuits, where $t<r$ and $s+t=r$, disconnecting each of the t functional circuits from all decoders except a redundant decoder programmable with the second address, to thereby provide the second address with the same number of functional circuits as the first address.

22. A method as in claim 20 wherein a set of bit position input and output lines for each bit position in a byte are connected to each one of the plurality of circuits, and the method further comprises:
assigning a pair of the input and output lines to each functional circuit in a bit position order;
isolating each functional circuit assigned a pair of input and output lines from all other bit position input and output lines.

23. A method as in claim 20 wherein the plurality of circuits is arranged in rows, each row including a plurality of circuit select lines connected to each circuit in the row, and the method further comprises:
assigning functional circuits to a row position by isolating those functional circuits from all of the circuit select lines except that circuit select line corresponding to the row to which those functional circuits are to be assigned.

24. A method of fabricating a group of interconnected functional circuits on a semiconductor wafer comprising:
fabricating on the semiconductor wafer a plurality of electrically isolated circuits each circuit having at least one decoder means capable of being programmed to respond to specific address information, at least one function means for manipulating data connected to each of the at least one decoder means, and at least one interconnecting grid pad connected to at least one of the decoder means and the function means;
testing all of the plurality of circuits, including both the decoder means and the function means, to determine whether each circuit is a functional circuit or a non-functional circuit;
after the step of testing:
isolating each non-functional circuit from at least one of its interconnecting grid pads;
assigning arbitrary addresses to the at least one decoder means associated with the functional circuits; and
forming a common conductive grid to interconnect the interconnecting grid pads, the arrangement of which grid is independent of the distribution of functional and non-functional circuits on the wafer.

25. A method as in claim 24 wherein the step of forming a common conductive grid comprises forming a metal pattern over the circuits spearated therefrom by insulating material except where connected to the interconnecting grid pads.

26. A method as in claim 25 wherein the common conductive grid comprises a series of interconnecting lines forming an address bus and a data bus.

27. A method as in claim 26 wherein the address bus is coupled to the decoder means of each circuit and the data bus is coupled to the function means of each circuit.

28. A method as in claim 25 wherein prior to the step of forming a common conductive grid, a step is performed comprising:
programming the decoder means associated with each functional circuit with a desired address.

29. A method as in claim 28 wherein the decoder means includes a plurality of fusible connections, and the step of programming the decoder means comprises opening selechted ones of the plurality of fusible connections.

30. A method as in claim 28 wherein the step of programming the decoder means comprises:
   programming a plurality of the decoder means with the same specific address so that a plurality of the decoder means respond to the same specific address.

31. A method as in claim 28 wherein each of the decoder means is programmed with a unique specific address different from the address for each other decoder means.

32. A semiconductor structure comprising:
   a semiconductor wafer;
   a plurality of functional and non-functional circuits formed on the wafer, each circuit having at least one decoder means capable of being programmed to respond to specific address information, at least one function means for manipulating data, the function means being connected to each of the at least one decoder means, and at least one interconnecting grid pad connected to at least one of the decoder means and the function means;
   means for assigning an arbitrary address to each of the functional circuits, whereby non-functional circuits are isolated from the conductive grid by disconnecting at least one of the interconnecting grid pads from each non-functional circuit; and
   a conductive grid formed on the water to electrically connect the interconnecting grid pads, which common conductive grid is independent of the distribution of functional and non-functional circuits on the wafer, the common conductive providing a series of interconnecting conductive lines for transfer of address information and data, which conductive lines are connected to at least the function means in each of the plurality of circuits.

* * * * *